(12) United States Patent
Chang

(10) Patent No.: US 10,923,177 B1
(45) Date of Patent: Feb. 16, 2021

(54) DELAY-LOCKED LOOP, MEMORY DEVICE, AND METHOD FOR OPERATING DELAY-LOCKED LOOP

(71) Applicant: NANYA TECHNOLOGY CORPORATION, New Taipei (TW)

(72) Inventor: Chuan-Jen Chang, Hsinchu County (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/725,239

(22) Filed: Dec. 23, 2019

(51) Int. Cl.
  *G06F 12/00* (2006.01)
  *G11C 11/4076* (2006.01)
  *G11C 11/4096* (2006.01)
  *H03L 7/081* (2006.01)

(52) U.S. Cl.
  CPC ...... *G11C 11/4076* (2013.01); *G11C 11/4096* (2013.01); *H03L 7/0816* (2013.01)

(58) Field of Classification Search
  CPC ............. G11C 11/4076; G11C 11/4096; H03L 7/0816
  USPC .......................................................... 365/194
  See application file for complete search history.

(56) References Cited

U.S. PATENT DOCUMENTS

| | | | |
|---|---|---|---|
| 8,769,194 B2 * | 7/2014 | Fujisawa | G11C 11/40611 |
| | | | 711/106 |
| 2013/0031305 A1 * | 1/2013 | Fujisawa | G11C 29/028 |
| | | | 711/106 |

* cited by examiner

*Primary Examiner* — Xiaochun L Chen
(74) *Attorney, Agent, or Firm* — Muncy, Geissler, Olds & Lowe, P.C.

(57) ABSTRACT

A delay-locked loop circuit includes a delay line and a control unit. The delay line functions to delay an input signal to generate a first delay signal. The control unit receives the input signal, an access start signal and an access end signal, and functions to generate a control signal according to the input signal, the access start signal and the access end signal, wherein the control signal functions to control the delay line between two read operations.

18 Claims, 7 Drawing Sheets

DELAY-LOCKED LOOP, MEMORY DEVICE, AND METHOD FOR OPERATING DELAY-LOCKED LOOP

TECHNICAL FIELD

The present disclosure relates to semiconductor electronic circuits, and more particularly, to delay-locked loop circuits, memory devices employing the delay-locked loop circuits, and methods of operating delay-locked loop circuits.

DISCUSSION OF THE BACKGROUND

In general, a delay-locked loop (DLL) circuit of a dynamic random access memory (DRAM) is utilized to adjust the time difference between a data output and input clock signals in the DRAM until they are aligned. The memory can be operated in a normal mode, a self-refresh mode, or a power-down mode. In the normal mode, the memory is accessed for read/write operations and the DLL circuit delays an input clock signal to generate a delayed clock signal during read operations. In the self-refresh mode, the memory executes a self-refresh operation without any help from an external circuit. In the power-down mode, the memory is in a stand-by mode and does not perform any data access.

When a read request enters the DRAM, the DLL circuit and an output buffer are turned on, and a phase detector compares a reference clock signal derived from an input clock signal and a feedback signal provided by the DLL circuit to determine an adjustment value of the delay line in the DLL circuit. Referring to FIG. 1, to limit power consumption, after a first read operation READ_01 is completed and before a second read operation READ_02 is requested, the DLL circuit and the output buffer are typically turned off. Therefore, a voltage VDLL provided to the DLL circuit increases; after a predetermined period of time Ts has elapsed, the voltage VDLL reaches a predetermined saturation voltage Vsat. Ideally, when the second read operation READ_02 is requested, the voltage VDLL decreases due to the DLL circuit being turned on; however, a (request) response time Td of the DLL circuit causes a misalignment of the input clock signal CLKIN and the output data DQ.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a delay-locked loop circuit, including a delay line and a control unit. The delay line is configured for delaying an input signal to generate a first delay signal. The control unit receives the input signal, an access start signal and an access end signal; the control unit is configured for generating a control signal according to the input signal, the access start signal and the access end signal, wherein the control signal functions to control the delay line between two read operations.

In some embodiments, the control unit transmits the control signal to the delay line after a number of clock cycles have occurred.

In some embodiments, the control unit further comprises a counter for counting the number of clock cycles.

In some embodiments, the control unit transmits the control signal to the delay line after a time period has elapsed.

In some embodiments, the control unit further comprises a timer for determining the time period.

In some embodiments, the delay-locked loop circuit further comprises a phase detector receiving the input signal and a feedback signal; the phase detector is configured for selectively detecting phases of the input signal and the feedback signal to generate a phase detection result to control the delay line during the read operations, wherein the feedback signal is generated according to the first delay signal. In some embodiments, the delay-locked loop circuit further comprises a clock tree, an off-chip device and a delay mimic. The clock tree is configured for delaying the first delay signal to generate a second delay signal. The off-chip device (OCD) receives the second delay signal and an output data. The delay mimic receives the first delay signal and generates the feedback signal, wherein a dummy delay in the feedback signal is used to match delays of the clock tree and the OCD.

Another aspect of the present disclosure provides a memory device including a plurality of memory cells and a plurality of peripheral devices for reading data from and writing data to the memory cells. The peripheral devices comprise a delay-locked loop circuit including a delay line and a control unit. The delay line is configured for delaying an input signal to generate a first delay signal. The control unit receives the input signal, an access start signal and an access end signal, and is configured for generating a control signal according to the input signal, the access start signal and the access end signal, wherein the control signal controls the delay line between two read operations.

In some embodiments, the control unit transmits the control signal to the delay line after a number of clock cycles have occurred.

In some embodiments, the control unit further comprises a counter for counting the number of clock cycles.

In some embodiments, the control unit transmits the control signal to the delay line after a time period has elapsed.

In some embodiments, the control unit further comprises a timer for determining the time period.

In some embodiments, the memory device further comprises a phase detector, wherein the phase detector receives the input signal and a feedback signal and the phase detector is configured for selectively detecting phases of the input signal and the feedback signal to generate a phase detection result, wherein the phase detection result functions to control the delay line during the read operations, and the feedback signal is generated according to the first delay signal.

In some embodiments, the memory device further comprises a clock tree, an OCD and a delay mimic; the clock tree is configured for delaying the first delay signal to generate a second delay signal. The OCD receives the second delay signal and an output data. The delay mimic receives the first delay signal and generates the feedback signal, wherein a dummy delay in the feedback signal is used to match delays of the clock tree and the OCD.

Another aspect of the present disclosure provides a method of operating a delay-locked loop circuit. The method comprises steps of applying an input signal to a delay line, delaying the input signal with the delay line, generating a first delay signal, inputting the input signal, an access start signal and an access end signal to a control unit, and generating a control signal by the control unit according to the input signal, the access start signal and the access end signal, wherein the control signal functions to control the delay line between read operations.

In some embodiments, the method further includes a step of counting a number of clock cycles between the access start signal and the access end signal by a counter, and generating the control signal after a predetermined number of clock cycles have been counted by the counter.

In some embodiments, the method further comprises a step of determining a time period between the access start signal and the access end signal by a timer, and generating the control signal after a time segment has elapsed.

In some embodiments, the method further comprises steps of inputting the input signal and a feedback signal to a phase detector, and selectively detecting phases of the input signal and the feedback signal by the phase detector to generate a phase detection result to control the delay line during read operations, wherein the feedback signal is generated according to the first delay signal.

Due to the control mechanisms of the delay-locked loop circuits in the present disclosure, misalignments between the output data and the input signal can be adjusted. By implementing a counter, a timer, or other suitable technologies in the control unit of the delay-locked loop circuits, the misalignments can be corrected at high speed with minimal power consumption.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, wherein like reference numbers refer to similar elements throughout the Figures.

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to delay-locked loop circuits, memory devices, and methods of operating delay-locked loop circuits. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Figure 1:
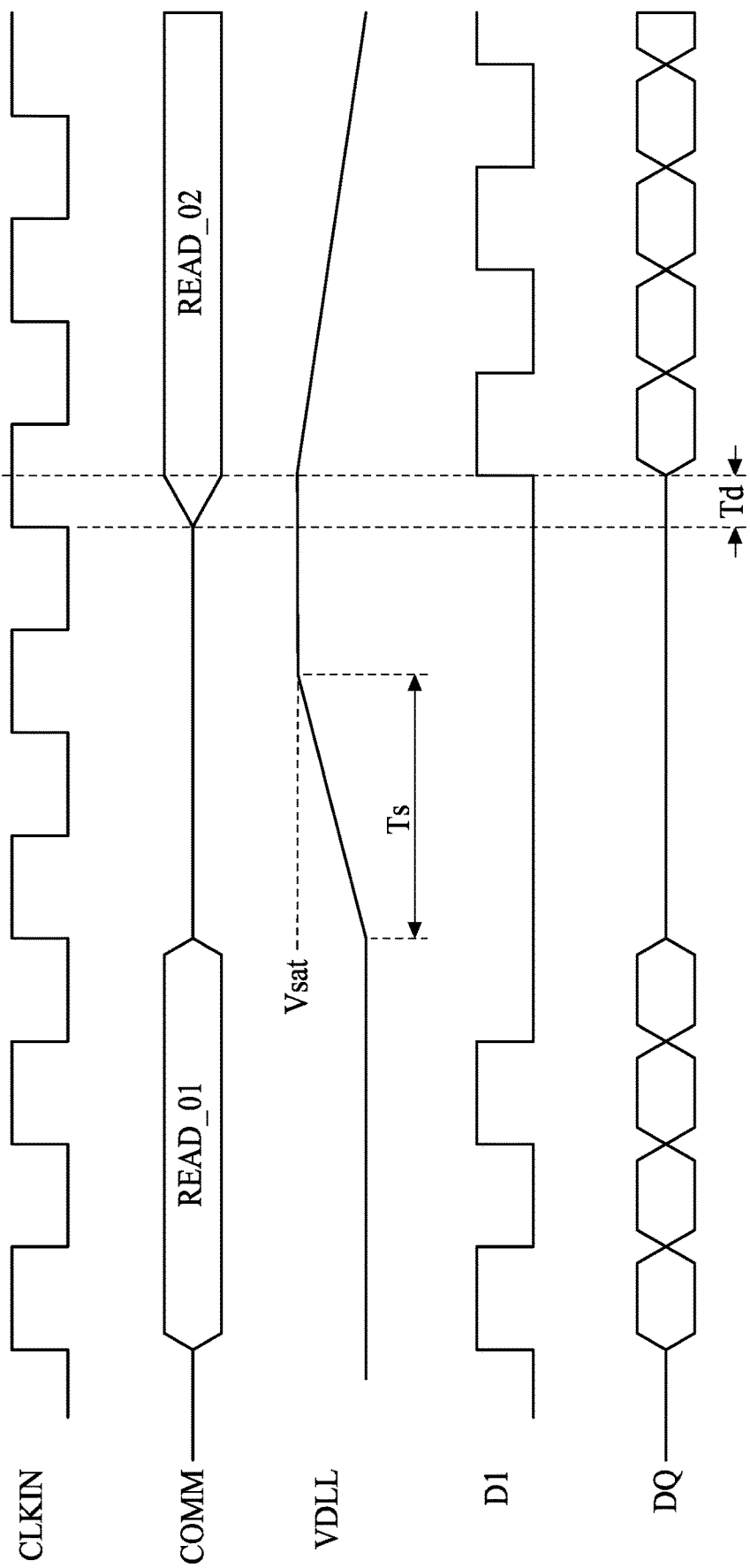
FIG. 1 is a diagram depicting the relationship among a command being entered into a memory, a voltage provided to a delay-locked loop circuit of the memory, a first delay signal provided by a delay line of the delay-locked loop circuit, and data outputted from the memory.
Figure 2:
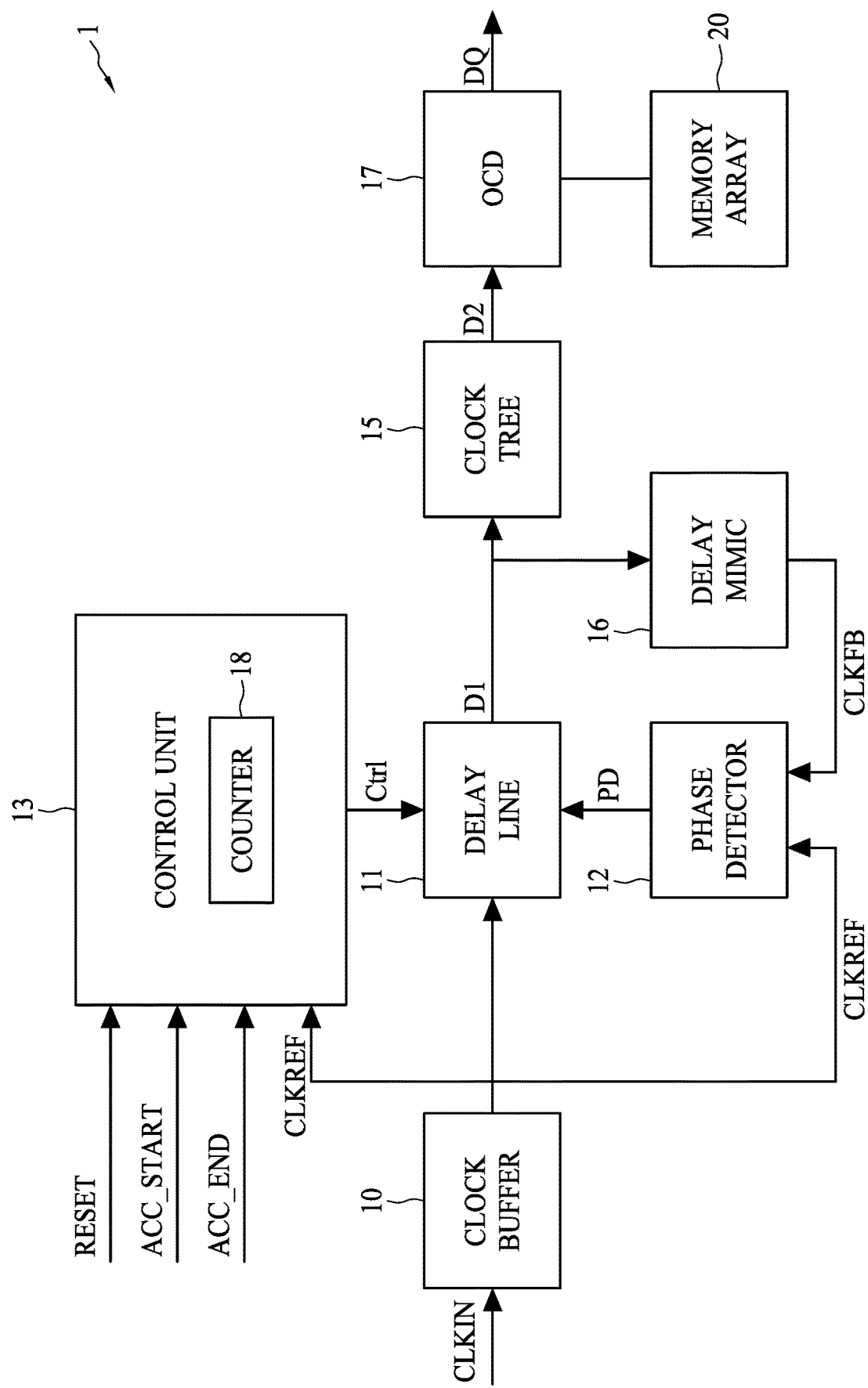
FIG. 2 is a block diagram depicting a delay-locked loop circuit in accordance with some embodiments of the present disclosure.

In accordance with some embodiments of the present disclosure, FIG. 2 is a block diagram depicting a delay-locked loop (DLL) circuit 1. As shown in FIG. 2, an input clock signal CLKIN is supplied to a clock buffer 10 of a DLL circuit 1 configured to adjust a time difference between an output data DQ and the input clock signals CLKIN. The clock buffer 10 is coupled to a delay line 11, a phase detector 12 and a control unit 13. The clock buffer 10 receives the input clock signal CLKIN from an external system clock serving the microprocessor and provides a reference clock signal CLKREF. It should be noted that the clock buffer 10 may include one or more buffers which receive the input clock signal CLKIN.

In some embodiments, the delay line 11 is coupled to the control unit 13, the phase detector 12 and the clock buffer 10. The delay line 11 may include a plurality of delay units (not shown), which may include a network or a chain of inverters, for example, although other suitable implementations of the delay units may also be included. The reference clock signal CLKREF is supplied to the delay line 11, and the delay line 11 may delay the reference clock signal CLKREF with the delay units in delay stages to generate a first delay signal D1, which is provided to a clock tree 15 and a delay mimic 16.

The clock tree 15 may be a replica output signal buffer, which receives the first delay signal D1 and generates a second delay signal D2, which is provided to an off-chip driver (OCD) 17. The delay mimic 16 receives the first delay signal D1 and generates a feedback signal CLKFB. The delay mimic 16 may be a replica clock buffer, which generates the feedback signal CLKFB by buffering the first delay signal D1. The delay mimic 16 is configured to delay the first delay signal D1 from the delay line 11 by a specific period of time. In some embodiments, the delay mimic 16 is configured to provide the same delay period as those of the clock tree 15 and the OCD 17. In other words, a dummy delay in the feedback signal CLKFB is used to match delays of the clock tree 15 and the OCD 17.

In some embodiments, the OCD 17 is configured to latch the data from a memory array 20 having a plurality of memory cells (not shown) for storing data and transfer the data out of a memory device, including the memory array 20, to a data-requesting device, such as a microprocessor. The memory device and a system using the memory device will be described later in the present disclosure.

In some embodiments, the phase detector 12 receives the reference clock signal CLKREF and the feedback signal CLKFB as inputs for selectively detecting phases of the reference clock signal CLKREF and the feedback signal CLKFB and generating a phase detection result PD. The phase detection may be performed by a phase comparator (not shown), for example, which compares the relative timing of the (rising or falling) edges of the reference clock signal CLKREF and the feedback signal CLKFB. According to the phase detection result PD, the delay line 11 may adjust the delay stages of the delay units so as to establish the lock condition. The adjustment may be transmitted from shift registers or other suitable circuitry (not shown), and the phase detection result PD may, for example, include a shift left instruction (e.g., decrease the activated delay stage), or a shift right instruction (e.g., activate more delay stages), provided to the delay line 11.

As seen in FIG. 2, the DLL circuit 1 further includes a control unit 13 configured to generate a control signal Ctrl and provide the control signal Ctrl to the delay line 11, so that the delay line 11 can introduce at least one specific delay period to the reference clock signal CLKREF when a time interval between two read operations is equal to or greater than a predetermined period of time. In some embodiments, the control unit 13 may generate the control signal Ctrl in accordance with an access start signal ACC_START signal and an access end signal ACC_END issued by the memory device and the reference clock signal CLKREF from the clock buffer 10. In some embodiments, the time interval between two read operations can be at least determined by the reference clock signal REFCLK and the access end signal ACC_END. In alternative embodiments, the time interval between two read operations can be a time period beginning upon detection of the access end signal ACC_END and ending when the voltage provided to the DLL circuit 1 reaches a saturation voltage Vsat. Such time period can be a performance parameter indicating the behavior of the memory device. In some embodiments, the counter 18 can be reset when a reset signal RESET is received. The reset signal RESET can be provided by the microprocessor or the memory device.

Figure 3:
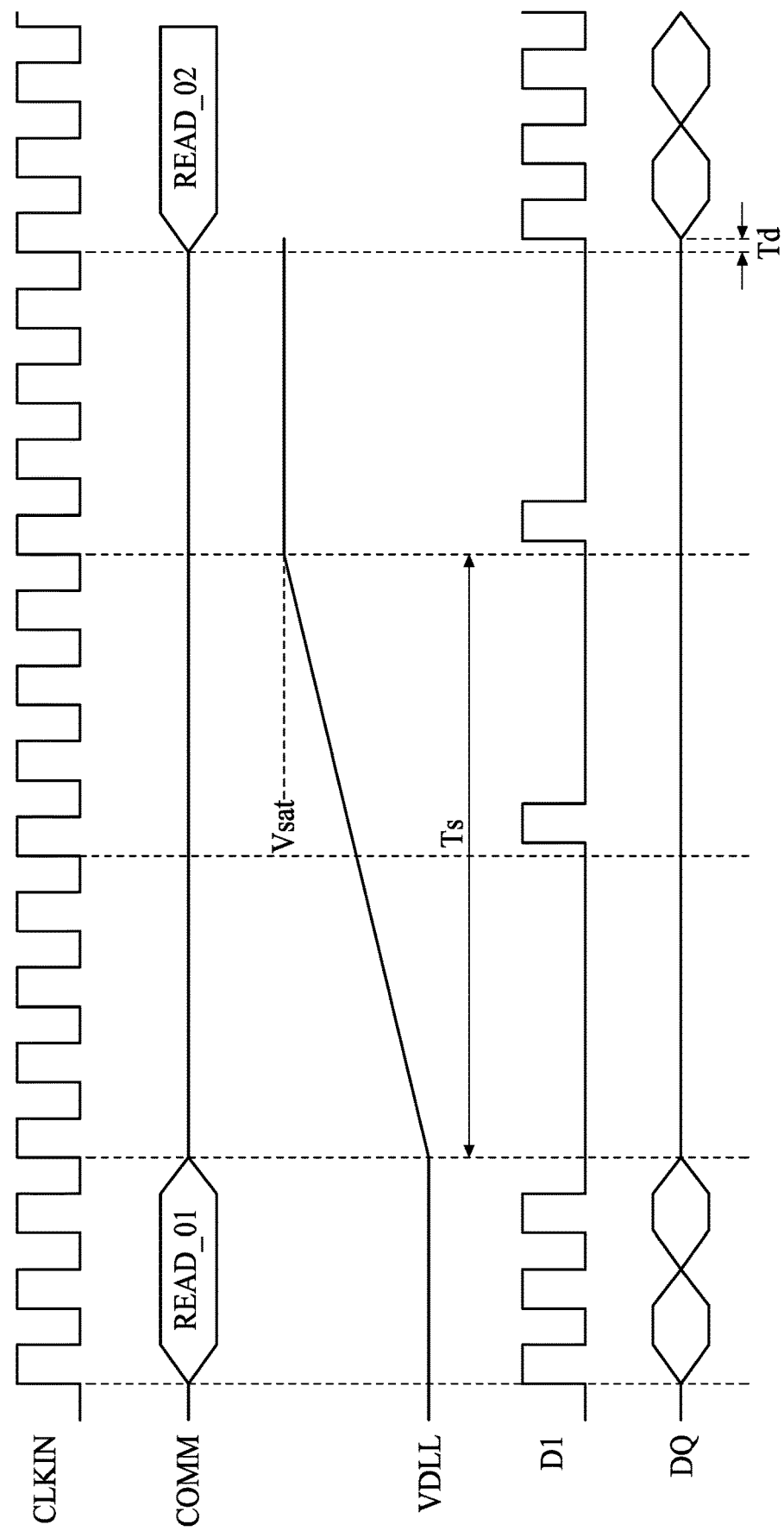
FIG. 3 is a diagram depicting the relationship among a command being entered into a memory device, a control voltage provided to a delay-locked loop circuit of the memory device, a first delay signal provided by a delay line of the delay-locked loop circuit, and data outputted from the memory device, in accordance with some embodiments of the present disclosure.

With reference to FIG. 3, the diagram includes timing diagrams of an input clock signal CLKIN, the command COMM entered into the memory device, the control voltage VDLL provided to the DLL circuit 1, the first delay signal D1 provided by the delay line 11, and data DQ transferred out of the memory device. The data DQ may be data requested by the data-requesting device. During a first read operation READ_01, the DLL circuit 1 and the clock tree 15 may be enabled, and the phase detector 12 detects the phases of the reference clock signal CLKREF and the feedback signal CLKFB and generates the phase detection result PD to the delay line 11 in the DLL circuit 1. Therefore, the delay line 11 can generate the first delay signal D1 in accordance with the phase detection result PD provided by the phase detector 12. After the first read operation READ_01 is completed, the clock tree 15 is disabled until a second read operation READ_02 is requested, and the delay line 11 is periodically enabled by the control unit 33 to shift the phase of the reference clock signal CLKREF so as to reduce the time difference Td between the input clock signal CLKIN and the data DQ when the second read request enters.

Referring again to FIG. 2, in some embodiments, the control unit 13 further includes a counter 18 for counting a number of clock cycles between the access end signal ACC_END of the first read operation READ_01 and the access start signal ACC_START of the second read operation READ_02. In alternative embodiments, the counter 18 can measure the time period beginning upon detection of the access end signal ACC_END and ending when the voltage provided to the DLL circuit 1 reaches the saturation voltage Vsat. The control signal Ctrl may be generated according to the number of clock cycles counted by the counter 18, for example. In some embodiments, the control unit 13 transmits the control signal Ctrl to the delay line 11 after a predetermined number of clock cycles have been counted.

In some embodiments, the delay line 11 may activate a quantity of the delay units according to the control signal Ctrl. The delay units may be activated in delay stages according to the control signal Ctrl, for example. In some embodiments, the adjustment of the delay units may be transmitted from shift registers or other suitable circuitry (not shown). The control signal Ctrl may include, for example, a shift left instruction (e.g., to decrease the activated delay stages) or a shift right instruction (e.g., to activate additional delay stages) provided to the delay line 11.

The control mechanism of the control unit 13 in the DLL circuit 1 is described in an example below. Referring to FIG. 3, after the first read operation READ_01 is completed and the access end signal ACC_END is received by the control unit 13, the counter 18 of the control unit 13 may count clock cycles of the reference clock signal CLKREF until the access start signal ACC_START is received or until the specific number of clock cycles have been counted. The control unit 13 can provide at least one control signal Ctrl to the delay line 11 and shift the phase of the reference clock signal CLKFB when the counted clock cycle is equal to the specific number of the clock cycles. Since the delay stages of the delay line 11 have been adjusted according to the control signal Ctrl before the second read operation READ_02 by the control unit 13, wherein the delay stages are determined by the number of clock cycles counted by the counter 18 in the control unit 13, the DLL circuit 1 is able to reduce the (request) response time Td of the second read operation READ_02.

Figure 4:
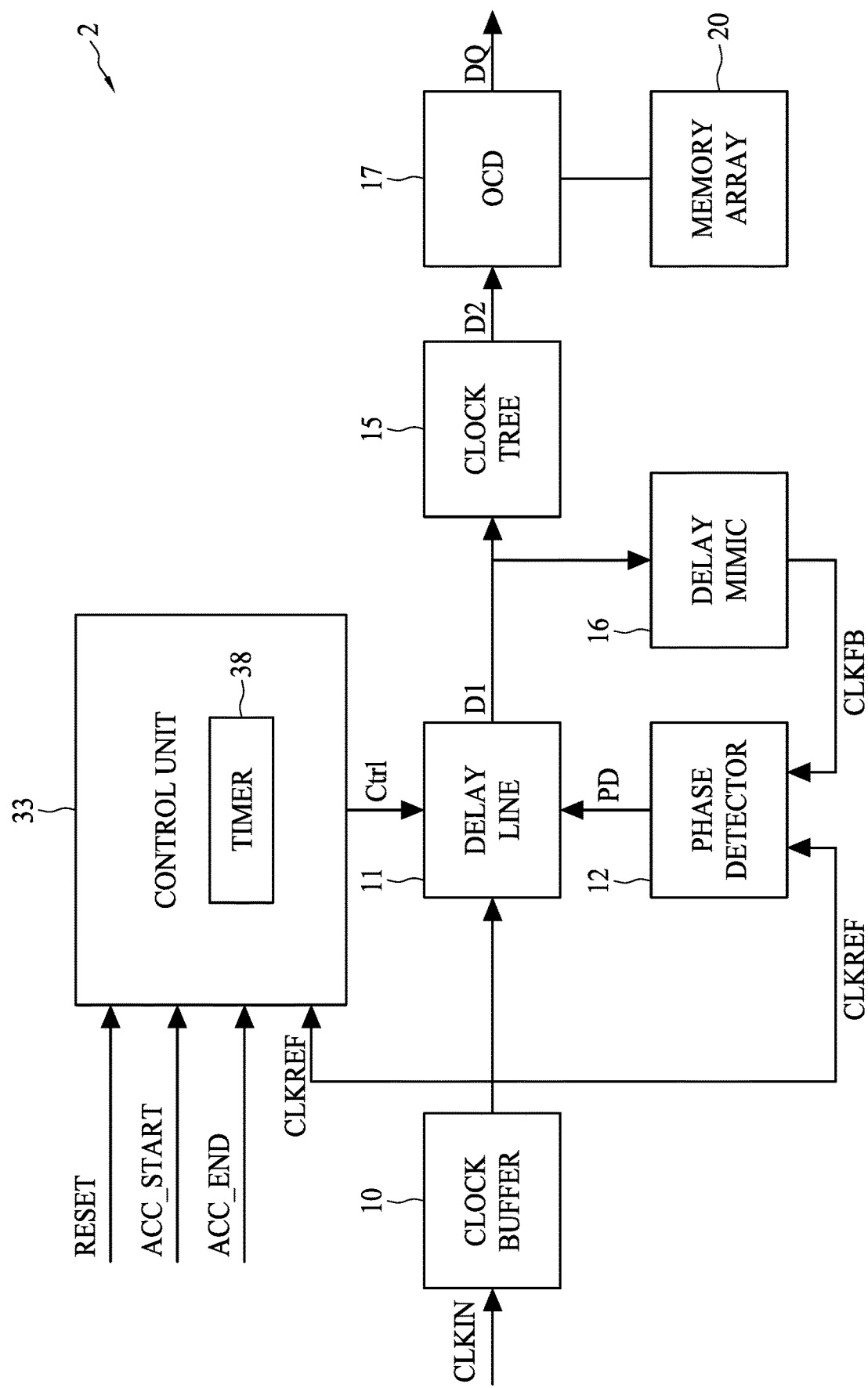
FIG. 4 is a block diagram depicting a delay-locked loop circuit in accordance with some embodiments of the present disclosure.

It should be noted that the control unit 13 in the DLL circuit 1 may be implemented by other suitable technologies. FIG. 4 is a block diagram depicting another DLL circuit according to some embodiments of the present disclosure. With reference to FIG. 4, a DLL circuit 2 may include elements similar to those of the DLL circuit 1, and discussion of these similar elements will not be repeated herein. A difference between the DLL circuit 2 and the DLL circuit 1 lies in a control unit 33 of the DLL circuit 2. In some embodiments, the control unit 33 further includes a timer 38 for determining a time period between the access end signal ACC_END of the first read operation READ_01 and the access start signal ACC_START of the second operation READ_02 of a memory device employing the DLL circuit 2. The control signal Ctrl may be generated according to the time period determined by the timer 38. For example, the timer 38 may determine a predetermined time period between two read operations of the memory device, and the control signal Ctrl may be generated according to the predetermined time period determined by the timer 38. In some embodiments, the control unit 33 transmits the control signal Ctrl to the delay line 11 after a specific time period has elapsed. In some embodiments, the time period between two read operations may include a plurality of time segments, and the control unit 33 may transmit the control signal Ctrl to the delay line 11 and thereby delay the reference clock signal CLKREF after each time segment has elapsed. In some embodiments, the timer 38 can be reset when a reset signal RESET is received.

In other embodiments, a control unit of another DLL circuit may include a circuit element that determines the voltage level of the control voltage VDLL shown in FIG. 2. In this DLL circuit, the control signal Ctrl may be generated according to the voltage level as determined by the circuit element in the control unit.

Figure 5:
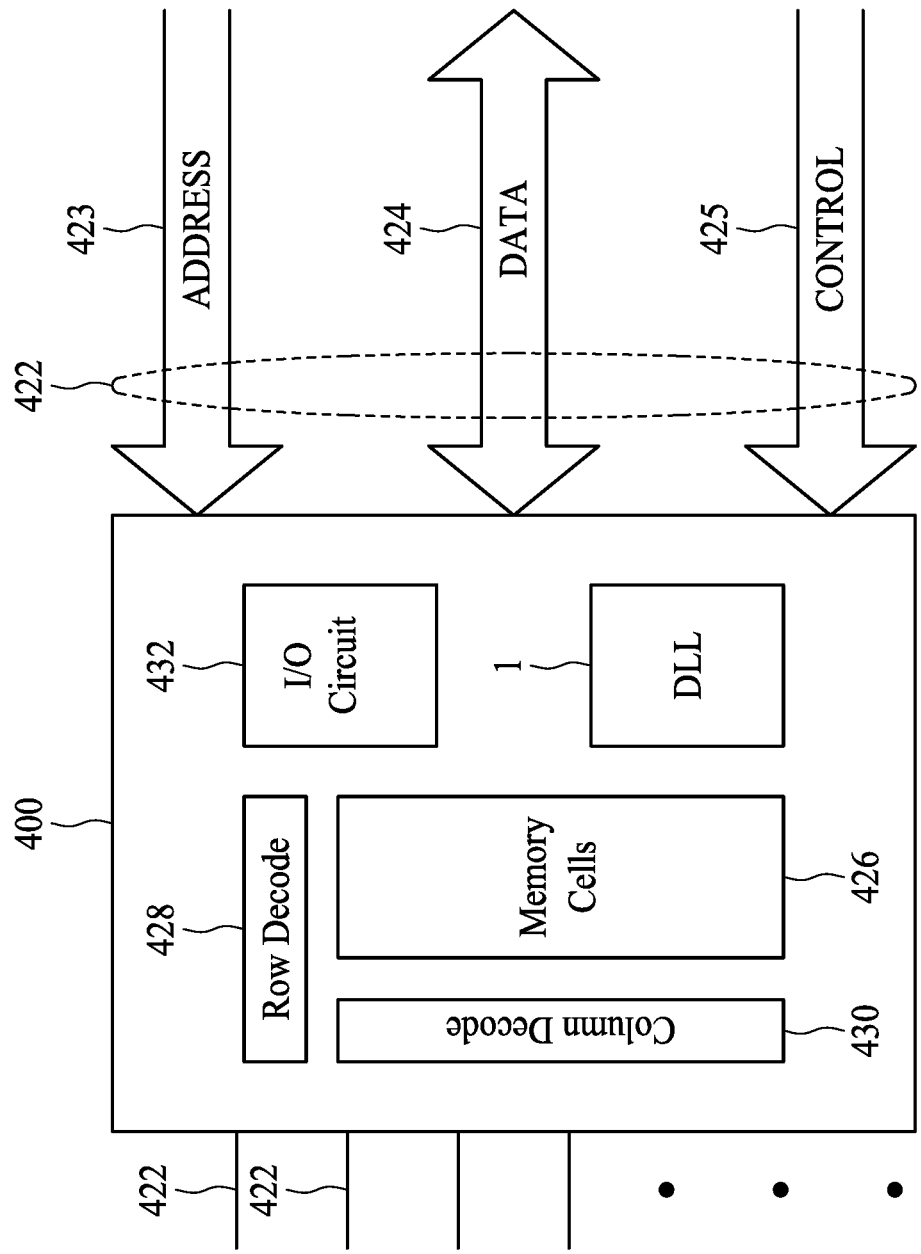
FIG. 5 is a block diagram depicting a memory device employing a delay-locked loop circuit according to some embodiments of the present disclosure.

FIG. 5 is a block diagram depicting a memory device 400 employing a DLL circuit according to some embodiments of the present disclosure. A memory device 400 may be a memory chip employing the DLL circuit 1 of FIG. 2, for example, although other DLL circuits of the present embodiment may also be used, such as the DLL circuit 2 of FIG. 4. The memory device 400 may be part of a DIMM (dual in-line memory module) or a PCB (printed circuit board) containing many such memory chips (not shown). The memory device 400 may include a plurality of pins 422 located outside of the memory device 400 for electrically connecting the memory device 400 to other system devices. Some of the pins 422 may include memory address pins or address bus 423, data pins or data bus 424, and control pins or control bus 425. It should be noted that each of the reference numerals 423 to 425 may refer to more than one pin in the corresponding bus. It should also be understood that the schematic in FIG. 5 is for illustration only. That is, the pin arrangement or configuration in a typical memory device or memory chip may not be in the form shown in FIG. 5.

A processor or memory controller (shown in FIG. 6) may communicate with the memory device 400 and perform memory read/write operations. The processor and the memory device 400 may communicate using address signals on the address lines or address bus 423, data signals on the data lines or data bus 424, and control signals (e.g., a row address strobe (RAS) signal, a column address strobe (CAS) signal, etc. (not shown)) on the control lines or control bus 425. The width or number of pins of the address, data and control buses may differ from one memory configuration to another. Those of ordinary skill in the art will readily recognize that the memory device 400 of FIG. 5 is simplified to illustrate one embodiment of a memory device and is not intended to be a detailed illustration of all of the features of a typical memory chip. Numerous peripheral devices or circuits may be typically provided along with the memory device 400 for writing data to and reading data from the memory device 400. However, these peripheral devices or circuits are not shown in FIG. 5 for the sake of clarity.

The memory device 400 may include a plurality of memory cells 426 generally arranged in rows and columns for storing data therein. Each memory cell 426 may store a bit of data. A row decode circuit 428 and a column decode circuit 430 may select the rows and columns in the memory cells 426 in response to decoding an address, as provided on the address bus 423. Data is then transferred between the memory cells 426 and the data bus 424 via sense amplifiers and a data output path (not shown). A memory controller (not shown) may provide relevant control signals (not shown) on the control bus 425 to control data communication to and from the memory chip 420 via an input/output (I/O) unit 432. The I/O unit 432 may include a number of data output buffers (not shown) to receive the data bits from the memory cells 426 and provide the data bits or data signals to the corresponding data lines in the data bus 424. The memory device 400 may further include a DLL circuit (e.g., the DLL circuit 1 of FIG. 2) to adjust the time difference between an output data DQ and an input clock CLKIN.

The memory controller may determine the modes of operation of the memory device 400. Some examples of the input signals or control signals on the control bus 425 may include an external clock signal, a chip select signal, a row access strobe signal, a column access strobe signal, a write enable signal, etc. The memory device 400 communicates with other devices connected thereto via the pins 422 on the memory device 400. These pins, as mentioned above, may be connected to the appropriate address, data and control lines to carry out data transfer operations.

Figure 6:
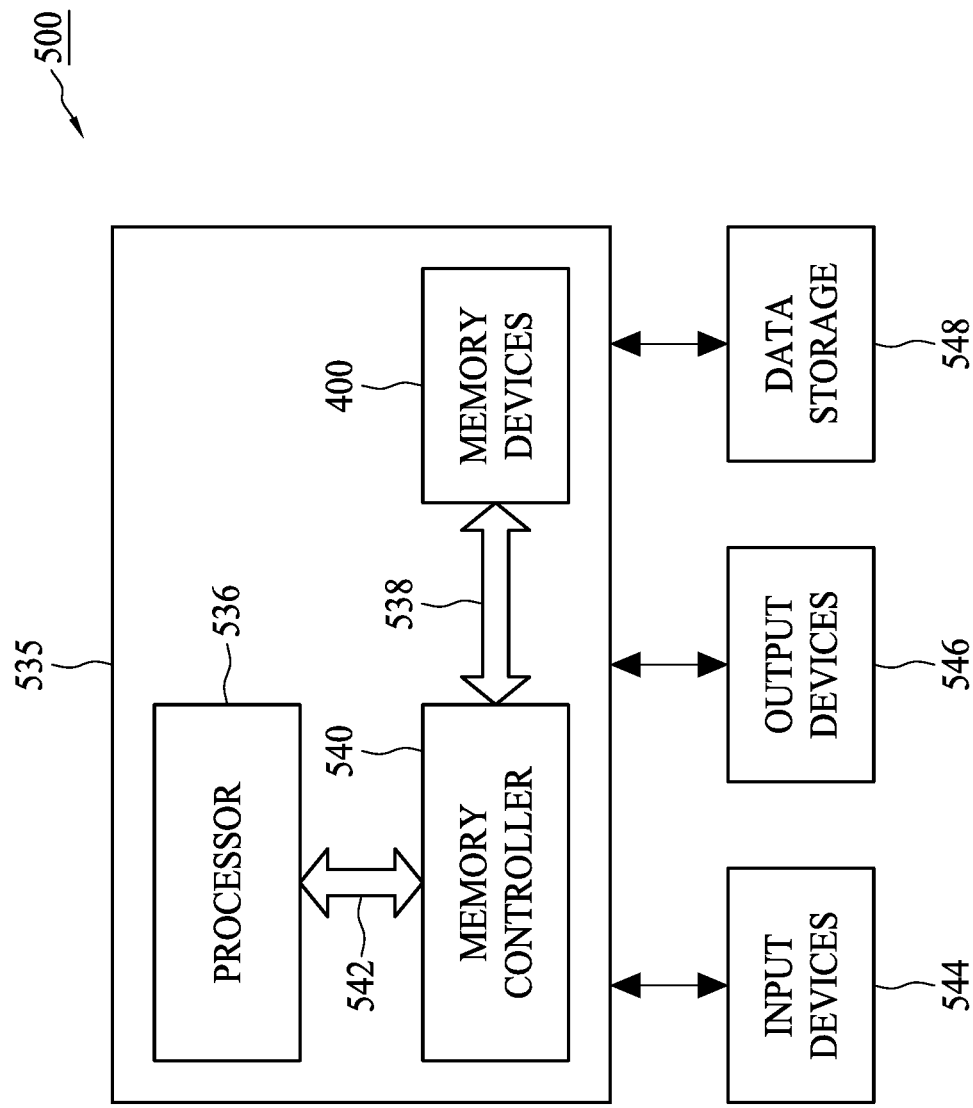
FIG. 6 is a block diagram depicting a system in which one or more of the memory devices of FIG. 5 are used, in accordance with some embodiments of the present disclosure.

FIG. 6 is a block diagram depicting a system in which one or more of the memory devices 400 having the architecture shown in FIG. 5 are used, in accordance with some embodiments of the present disclosure. The system 500 may include a computing unit 535 that includes a processor 536 for performing various computing functions, such as executing specific software to perform specific calculations or data processing tasks. The computing unit 535 may also include memory devices 400 that are in communication with the processor 536 through a bus 538. The bus 538 may include an address bus, a data bus and a control bus (not shown). Each of the memory devices 400 can be a dynamic random access memory (DRAM) chip or another type of memory circuit such as an SRAM (static random access memory) chip or Flash memory. Furthermore, the DRAM can be a synchronous DRAM commonly referred to as an SGRAM (synchronous graphics random access memory), an SDRAM (synchronous dynamic random access memory), an SDRAM II, or a DDR SDRAM (double data rate SDRAM), as well as Synchlink or Rambus DRAMs. Those of ordinary skill in the art will readily recognize that the memory devices 400 of FIGS. 5 and 6 are simplified to illustrate one embodiment of a memory device and are not intended to be a detailed illustration of all of the features of a typical memory chip. The processor 536 can perform a plurality of functions based on information and data stored in the memory devices 400. The processor 536 can be a microprocessor, digital signal processor, embedded processor, micro-controller, dedicated memory test chip, or the like.

Each of the memory devices 400 may have a configuration similar to that shown in FIG. 5 (i.e., each memory device 400 may include the DLL circuits constructed according to embodiments of the present disclosure). The same reference numeral 400 is used in FIGS. 5 and 6 to refer to these memory devices. A memory controller 540 controls data communication to and from the memory devices 400 in response to control signals (not shown) received from the processor 536 over the bus 542. The memory controller 540 may include a command decode circuit (not shown). The command decode circuit may receive the input control signals (on the bus 542) to determine the modes of operation of one or more of the memory devices 400. Some examples of the input signals or control signals on the bus 542 (and also on the bus 538) include an external clock signal, a chip select signal, a row access strobe signal, a column access strobe signal, and a write enable signal.

The system 500 may include one or more input devices 544 (e.g., a keyboard, a mouse, etc.) connected to the computing unit 535 to allow a user to manually input data, instructions, etc., to operate the computing unit 535. One or more output devices 546 connected to the computing unit 535 may also be provided as part of the system 500 to display or otherwise output data generated by the processor 536. Examples of output devices 546 include printers, video terminals or video display units (VDUs). In some embodiments, the system 500 also includes one or more data storage devices 548 connected to the data processing unit 535 to allow the processor 536 to store data in or retrieve data from internal or external storage media (not shown). Examples of typical data storage devices 548 include drives that accept hard and floppy disks, CD-ROMs (compact disk read-only memories) and tape cassettes.

Figure 7:
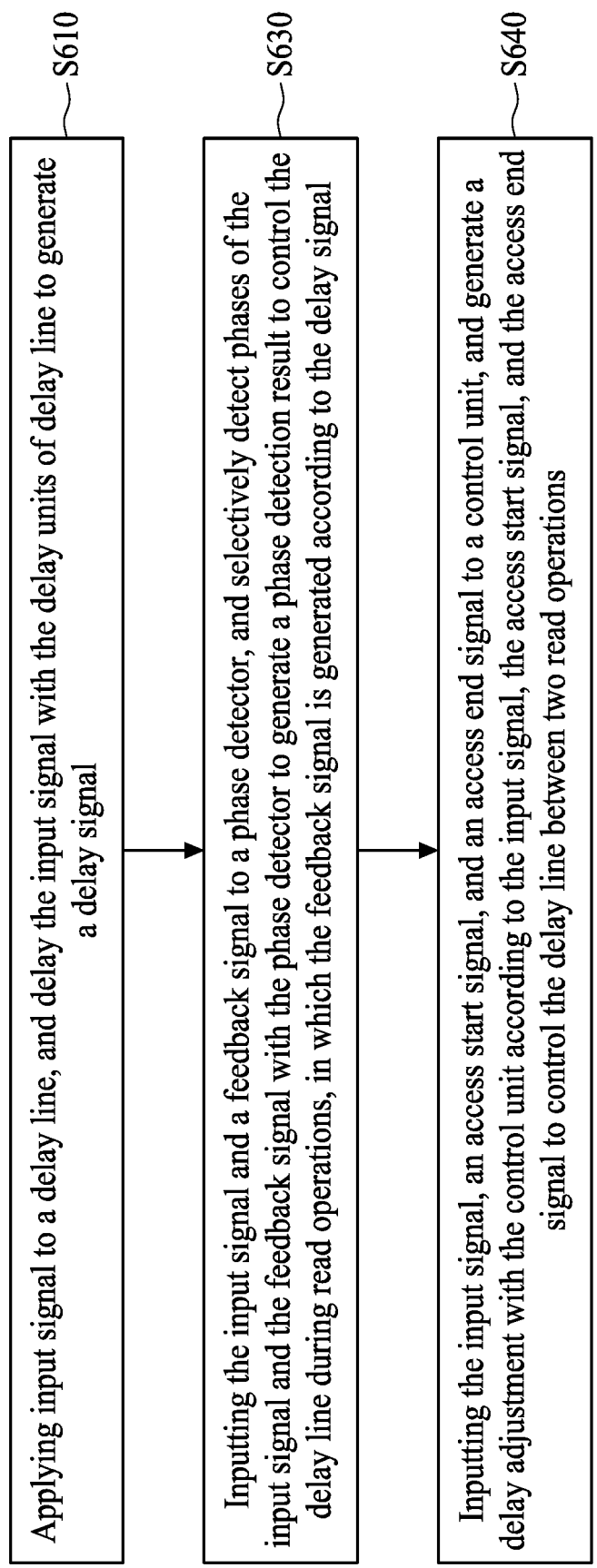
FIG. 7 is a flow diagram of a method of operating a delay-locked loop circuit in accordance with some embodiments of the present disclosure.

In accordance with some embodiments of the present disclosure, FIG. 7 is a flow diagram of a method of operating a delay-locked loop circuit. With reference to FIG. 7, the method includes applying an input signal to a delay line, and delaying the input signal with the delay line to generate a first delay signal (Step S610). The input signal and a feedback signal are inputted to a phase detector, and selective phase detection of the input signal and the feedback signal is performed by the phase detector to generate a phase detection result to control the delay line during read operations, in which the feedback signal is generated according to the first delay signal (Step S630). The input signal, an access start signal and an access end signal are inputted to a control unit, and a control signal is generated by the control unit according to the input signal, the access start signal and the access end signal to control the delay line between two read operations (Step S640).

In some embodiments, the method further includes counting a number of clock cycles between the access start signal and the access end signal by a counter, and generating the control signal according to the number of clock cycles counted by the counter.

In some embodiments, the method further includes determining a time period between the access start signal and the access end signal by a timer, and generating the control signal according to the time period determined by the timer.

One aspect of the present disclosure provides a delay-locked loop circuit, including a delay line and a control unit. The delay line functions to delay an input signal to generate a first delay signal. The control unit receives the input signal, an access start signal and an access end signal, and functions to generate a control signal according to the input signal, the access start signal and the access end signal, wherein the control signal functions to control the delay line between two read operations.

Another aspect of the present disclosure provides a memory device, including a plurality of memory cells and a plurality of peripheral devices for reading data from and writing data to the memory cells. The peripheral devices include a delay-locked loop circuit including a delay line and a control unit. The delay line functions to delay an input signal to generate a first delay signal. The control unit receives the input signal, an access start signal and an access end signal, and functions to generate a control signal according to the input signal, the access start signal and the access end signal, wherein the control signal functions to control the delay line between two read operations.

Another aspect of the present disclosure provides a method of operating a delay-locked loop circuit including: applying an input signal to a delay line and delaying the input signal to generate a first delay signal; and inputting the input signal, an access start signal and an access end signal to a control unit, and generating a control by the control unit according to the input signal, the access start signal and the access end signal, wherein the control functions to control the delay line between two read operations.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A delay-locked loop circuit, comprising:
  a delay line, including a plurality of delay units, for delaying an input signal to generate a first delay signal; and
  a control unit receiving the input signal, an access start signal and an access end signal, the control unit configured for generating a control signal according to the input signal, the access start signal and the access end signal, wherein the control signal functions to control the delay line to generate the first delay signal during a time interval between two read operations.

2. The delay-locked loop circuit of claim 1, wherein the control unit transmits the control signal to the delay line after a number of clock cycles have occurred.

3. The delay-locked loop circuit of claim 2, wherein the control unit further comprises a counter for counting the number of clock cycles.

4. The delay-locked loop circuit of claim 1, wherein the control unit transmits the control signal to the delay line after a time period has elapsed.

5. The delay-locked loop circuit of claim 4, wherein the control unit further comprises a timer for determining the time period.

6. The delay-locked loop circuit of claim 1, further comprising a phase detector receiving the input signal and a feedback signal, the phase detector configured for selectively detecting phases of the input signal and the feedback signal to generate a phase detection result, wherein the phase detection result functions to control the delay line during the read operations, and the feedback signal is generated according to the first delay signal.

7. The delay-locked loop circuit of claim 6, further comprising:
   a clock tree configured for delaying the first delay signal to generate a second delay signal;
   an off-chip device (OCD) receiving the second delay signal and an output data; and
   a delay mimic receiving the first delay signal and generating the feedback signal, wherein a dummy delay in the feedback signal is used to match delays of the clock tree and the OCD.

8. A memory device, comprising:
   a plurality of memory cells; and
   a plurality of peripheral devices for reading data from and writing data to the memory cells, the peripheral devices comprising a delay-locked loop circuit comprising:
   a delay line, including a plurality of delay units, the delay line configured for delaying an input signal to generate a first delay signal; and
   a control unit receiving the input signal, an access start signal and an access end signal, the control unit configured for generating a control signal according to the input signal, the access start signal and the access end signal to control the delay line to generate the first delay signal during a time interval between two read operations.

9. The memory device of claim 8, wherein the control unit transmits the control signal to the delay line after a number of clock cycles have occurred.

10. The memory device of claim 9, wherein the control unit further comprises a counter for counting the number of clock cycles.

11. The memory device of claim 8, wherein the control unit transmits the control signal to the delay line after a time period has elapsed.

12. The memory device of claim 11, wherein the control unit further comprises a timer for determining the time period.

13. The memory device of claim 8, further comprising a phase detector receiving the input signal and a feedback signal, the phase detector configured for selectively detecting phases of the input signal and the feedback signal to generate a phase detection result, wherein the phase detection result functions to control the delay line during the read operations, and the feedback signal is generated according to the first delay signal.

14. The memory device of claim 8, further comprising:
   a clock tree configured for delaying the first delay signal to generate a second delay signal;
   an off-chip device (OCD) receiving the second delay signal and an output data; and
   a delay mimic receiving the first delay signal and generating the feedback signal, wherein a dummy delay in the feedback signal is used to match delays of the clock tree and the OCD.

15. A method of operating a delay-locked loop circuit, comprising:
   applying an input signal to a delay line including a plurality of delay units, and delaying the input signal with the delay line to generate a first delay signal; and
   inputting the input signal, an access start signal and an access end signal to a control unit, and generating a control signal by the control unit according to the input signal, the access start signal and the access end signal, wherein the control signal functions to control the delay line to generate the first delay signal during a time interval between read operations.

16. The method of claim 15, further comprising counting a number of clock cycles between the access start signal and the access end signal by a counter, and generating the control signal after a predetermined number of clock cycles have been counted by the counter.

17. The method of claim 15, further comprising determining a time period between the access start signal and the access end signal by a timer, and generating the control signal after a time segment has elapsed.

18. The method of claim 15, further comprising:
   inputting the input signal and a feedback signal to a phase detector, and selectively detecting phases of the input signal and the feedback signal by the phase detector to generate a phase detection result, wherein the phase detection result functions to control the delay line during the read operations, and the feedback signal is generated according to the first delay signal.

* * * * *